US012596093B2

(12) United States Patent
Nakazumi

(10) Patent No.: US 12,596,093 B2
(45) Date of Patent: Apr. 7, 2026

(54) ORGANIC SEMICONDUCTOR DEVICE WITH PROTECTIVE SPINEL OXIDE LAYER

(71) Applicant: NIKON CORPORATION, Tokyo (JP)

(72) Inventor: Makoto Nakazumi, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 871 days.

(21) Appl. No.: 17/411,805

(22) Filed: Aug. 25, 2021

(65) Prior Publication Data

US 2022/0034837 A1 Feb. 3, 2022

Related U.S. Application Data

(63) Continuation of application No. PCT/JP2019/007093, filed on Feb. 25, 2019.

(51) Int. Cl.
| | |
|---|---|
| *G01N 27/416* | (2006.01) |
| *G01N 27/414* | (2006.01) |
| *H01L 21/02* | (2006.01) |
| *H10D 62/80* | (2025.01) |

(52) U.S. Cl.
CPC ....... *G01N 27/4145* (2013.01); *G01N 27/414* (2013.01); *G01N 27/4167* (2013.01); *H01L 21/02194* (2013.01); *H01L 21/02266* (2013.01); *H01L 21/02565* (2013.01); *H01L 21/02631* (2013.01); *H10D 62/80* (2025.01)

(58) Field of Classification Search
CPC ............. G01N 27/4145; G01N 27/414; G01N 27/4167; H01L 21/02194; H01L 21/02266; H01L 21/02565; H01L 21/02631; H01L 21/02554; H01L 29/786; H01L 29/24; H01L 29/78606; H01L 29/22–2206
See application file for complete search history.

(56) References Cited

U.S. PATENT DOCUMENTS

| | | | | |
|---|---|---|---|---|
| 4,881,109 A | * | 11/1989 | Ogawa ................... | B82Y 10/00 257/253 |
| 9,048,323 B2 | * | 6/2015 | Yamazaki ........... | H01L 29/4908 |
| 9,076,876 B2 | * | 7/2015 | Ichijo ................... | H01L 21/441 |
| 2007/0155037 A1 | * | 7/2007 | Chou ................... | G01N 27/414 438/49 |
| 2010/0006833 A1 | * | 1/2010 | Ha ....................... | H01L 29/7869 257/E21.04 |

(Continued)

FOREIGN PATENT DOCUMENTS

| | | |
|---|---|---|
| CN | 102652330 | 8/2012 |
| CN | 109314146 A | 2/2019 |

(Continued)

OTHER PUBLICATIONS

Kohn, Erhard, "1.06 Harsh Environment Materials", 2008, Elsevier B.V. (specifically 1.06.5.3.3—"Passivation layers") (Year: 2008).*

(Continued)

*Primary Examiner* — William B Partridge
*Assistant Examiner* — Gustavo G Ramallo

(57) ABSTRACT

Provided is a semiconductor device A including: a first electrode 10; a second electrode 20; a semiconductor layer 30 in contact with the first electrode 10 and the second electrode 20; and a protective layer 40 configured to cover at least a part of a surface of the semiconductor layer 30, wherein the protective layer 40 includes a spinel oxide.

16 Claims, 12 Drawing Sheets

(56)     References Cited

U.S. PATENT DOCUMENTS

| | | | |
|---|---|---|---|
| 2010/0025676 A1 | 2/2010 | Yamazaki et al. | |
| 2011/0089416 A1* | 4/2011 | Yamazaki | H01L 23/564 257/43 |
| 2011/0124153 A1* | 5/2011 | Hosoba | H01L 21/477 257/E21.09 |
| 2011/0127521 A1* | 6/2011 | Yamazaki | H01L 21/02472 156/60 |
| 2012/0058597 A1* | 3/2012 | Anthopoulos | H01L 29/7869 257/E21.46 |
| 2012/0220077 A1* | 8/2012 | Ha | H01L 29/7869 257/E21.411 |
| 2013/0056741 A1* | 3/2013 | Harumoto | H01L 27/1255 257/59 |
| 2013/0221346 A1* | 8/2013 | Lu | H01L 29/7869 257/43 |
| 2013/0306966 A1* | 11/2013 | Seon | H01L 29/7869 257/43 |
| 2015/0243738 A1* | 8/2015 | Shimomura | H01L 29/045 252/519.1 |
| 2015/0249161 A1* | 9/2015 | Su | H10D 30/6723 257/43 |
| 2015/0276663 A1* | 10/2015 | Takechi | H01L 29/7869 257/253 |
| 2015/0380561 A1* | 12/2015 | Won | H10D 99/00 257/43 |
| 2017/0179294 A1 | 6/2017 | Kato et al. | |
| 2017/0271374 A1* | 9/2017 | Zhang | H01L 29/45 |
| 2018/0358105 A1* | 12/2018 | Sasaki | G11C 11/54 |
| 2019/0181268 A1 | 6/2019 | Nakazumi et al. | |
| 2021/0034331 A1* | 2/2021 | Shibata | G01R 31/50 |

FOREIGN PATENT DOCUMENTS

| | | |
|---|---|---|
| JP | 2010-56540 | 3/2010 |
| JP | 2016-74580 | 5/2016 |
| JP | 2017-118106 | 6/2017 |
| TW | 201544458 A | 12/2015 |
| WO | WO2018/025647 | 2/2018 |

OTHER PUBLICATIONS

Zerarga et. al., "Structural, electronic and optical properties of spinel oxides ZnAl2O4, ZnGa2O4, and ZnIn2O4", Jun. 2011, Solid State Sciences 13 (2011) 1638-1648. (Year: 2011).*

Office Action, dated Jan. 16, 2023, in corresponding Taiwan Patent Application No. 108140248 (17 pp.)

Office Action, dated May 18, 2021, in counterpart Taiwan Patent Application No. 11020463450 (6 pp.)

Office Action, dated Aug. 19, 2022, in counterpart Taiwan Patent Application No. 108140248 (17 pp.)

Office Action, dated May 31, 2022, in Japanese Patent Application No. 2021-501397 (11 pp.)

Office Action, dated Jan. 11, 2021, in corresponding Taiwan Patent Application No. 108140248 (18 pp.).

International Search Report, dated May 21, 2019, in corresponding International Patent Application No. PCT/JP2019/007093 (4 pp.).

* cited by examiner

ORGANIC SEMICONDUCTOR DEVICE WITH PROTECTIVE SPINEL OXIDE LAYER

CROSS REFERENCE TO RELATED APPLICATIONS

This is a continuation application, filed under 35 U.S.C. § 111(a), of International Application No. PCT/JP2019/007093, filed Feb. 25, 2019, the disclosure of which is herein incorporated in its entirety by reference.

TECHNICAL FIELD

The present invention relates to a semiconductor device, a pH sensor, a biosensor, and a method for manufacturing a semiconductor device.

BACKGROUND ART

JP 2011-144064 A (PTL 1) discloses an organic semiconductor device including a protective film having a passivation effect, and a method for manufacturing the organic semiconductor device. In a related art, a metal oxide film such as an $SiO_2$ film and an $Al_2O_3$ film has been used as a material of such a protective film, and the protective layer has been required to be able to be efficiently formed.

PTL 1: JP 2007-053147 A

SUMMARY

A first aspect of the present invention is a semiconductor device including: a first electrode; a second electrode; a semiconductor layer in contact with the first electrode and the second electrode; and a protective layer configured to cover at least a part of a surface of the semiconductor layer, wherein the protective layer includes a spinel oxide.

A second aspect of the present invention is a pH sensor including the semiconductor device described above.

A third aspect of the present invention is a biosensor including the semiconductor device described above.

A fourth aspect of the present invention is a method for manufacturing the above-described semiconductor device, the method including forming the protective layer by performing sputtering.

DETAILED DESCRIPTION

Figure 1:
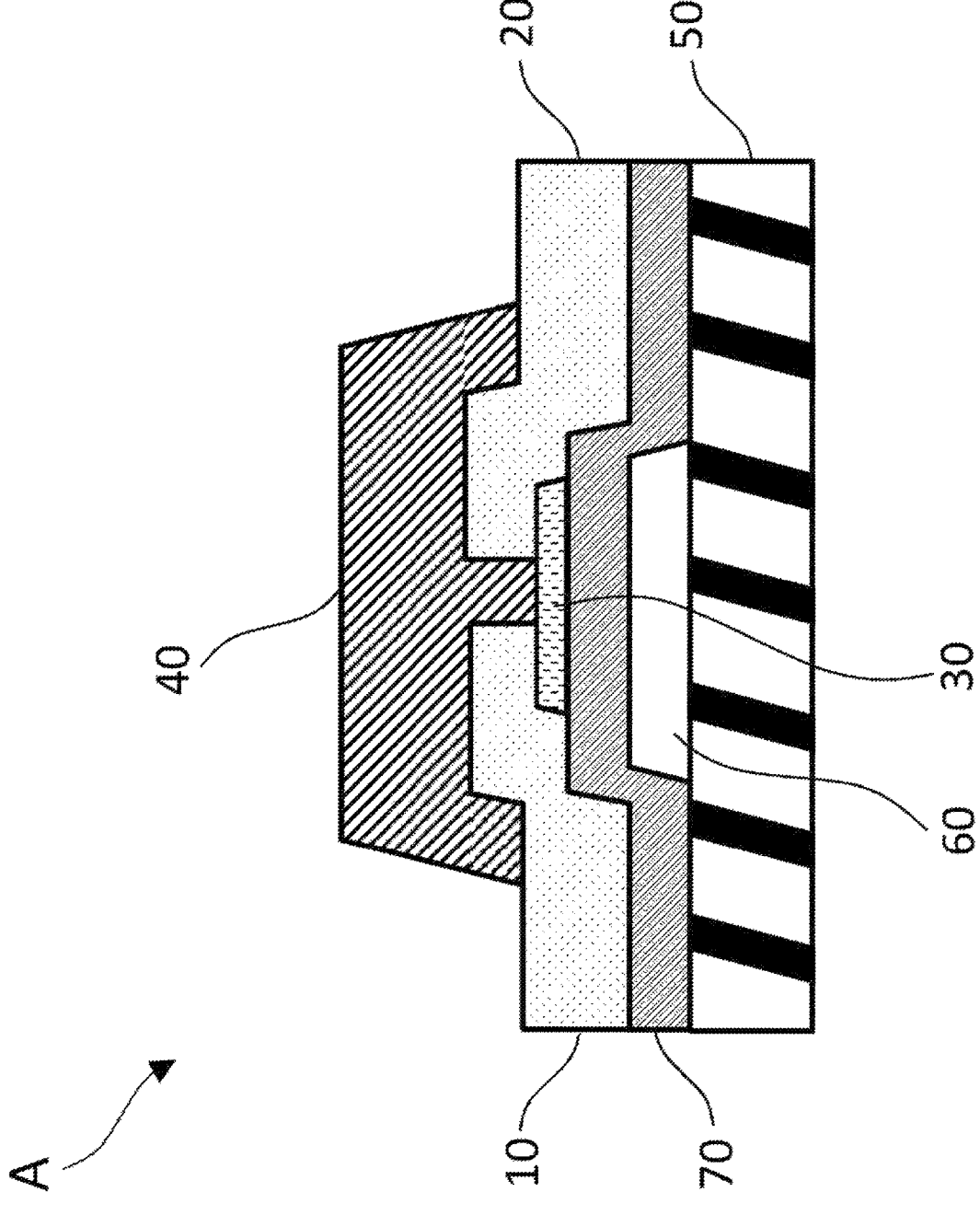
FIG. 1 is a schematic diagram of a semiconductor device A according to a first embodiment.

Hereinafter, detailed description is made on an embodiment of the present invention (hereinafter, simply referred to as the "present embodiment"). The present embodiment described below is an example for describing the present invention, and is not intended to limit the present invention to the contents described below. Note that, in the drawings, a positional relationship between up, down, left, right, and the like are based on a positional relationship illustrated in the drawings unless otherwise specified. Furthermore, a dimension ratio in the drawings is not limited to an illustrated ratio.

FIG. 1 is a schematic diagram of a semiconductor device A according to a first embodiment.

The semiconductor device A according to the first embodiment is a bottom gate-top contact (BGTC) semiconductor device. The semiconductor device A is a semiconductor device including a first electrode 10, a second electrode 20, a semiconductor layer 30 in contact with the first electrode 10 and the second electrode 20, and a protective layer 40 that covers at least a part of a surface of the semiconductor layer 30, wherein the protective layer 40 includes a spinel oxide.

The semiconductor device A includes a substrate 50, a third electrode 60 formed on the substrate 50, and an insulating layer 70 on a surface of the substrate 50 on a side on which the third electrode 60 is formed. The first electrode 10 is a source electrode, the second electrode 20 is a drain electrode, and the third electrode 60 is a gate electrode.

The semiconductor device A has advantages of a low film-formation temperature, a fast film-formation speed, and no entry of impurities by using, as the protective layer 40, an oxide having a spinel crystalline structure (hereinafter may be abbreviated as a "spinel oxide"). In addition, there is also an advantage of being able to easily manufacture the semiconductor device A even when a flexible substrate is used.

In a related art, for example, a metal oxide film such as silicon oxide and aluminum oxide has been used as a protective layer for various purposes, but has many problems, for example, a film-formation temperature and a film-formation speed. For example, when the metal oxide film is formed by chemical vapor deposition (CVD), there are problems such as a high film-formation temperature, necessity of a large-scale CVD film-formation device, and introduction of a large amount of impurities including hydrogen and carbon derived from a material gas. When the metal oxide film is formed by a high-frequency (RF) sputtering method, there is a problem such as a slow film-formation speed. Alternatively, when the metal oxide film is formed by a reactive sputtering method, there is a problem such as occurrence of insulation and optical absorption due to oxygen deficiency in the protective layer.

In this regard, the semiconductor device A can solve all the problems at once by using a spinel oxide as the protective layer 40. The spinel oxide can be more relatively easily and efficiently film-formed than the metal oxide film described above and the like.

Furthermore, the protective layer 40 of the semiconductor device A uses a stable spinel oxide, and can thus exhibit a passivation effect that is as excellent as or more excellent than a conventional protective layer using a metal oxide film. Thus, the semiconductor device A is also excellent in terms of a semiconductor property. Hereinafter, a configuration of the semiconductor device A will be described.

When the first electrode 10 is used as a source electrode, the source electrode is not particularly limited, and a known source electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like.

When the second electrode 20 is used as a drain electrode, the drain electrode is not particularly limited, and a known drain electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like.

The semiconductor layer 30 is formed in contact with the first electrode 10 and the second electrode 20. The semiconductor layer 30 is not particularly limited, and a known semiconductor layer can be adopted. Specific examples include an inorganic semiconductor of an oxide including zinc oxide (ZnO), In, Ga, and Zn, IGZTO in which tin is mixed in IGZO, an amorphous silicon, a low-temperature polysilicon, and the like. Particularly, an oxide including In, Ga, and Zn having an excellent semiconductor property is preferable, and more particularly, $InGaZnO_4$ (IGZO) is more preferable.

The semiconductor layer 30 is preferably doped with a carrier element in terms of further improving a semiconductor property. The carrier element is not particularly limited, and a known carrier element can be adopted in a doping process. Specific examples include hydrogen, monovalent metal, bivalent metal, and trivalent metal. Particularly, in the present embodiment, the semiconductor layer 30 is more preferably doped with hydrogen.

The protective layer 40 is a spinel oxide, and examples of the protective layer 40 include a spinel oxide including zinc and gallium (for example, spinel $ZnGa_2O_4$, and the like), a spinel oxide including zinc and indium (for example, spinel $ZnIn_2O_4$, and the like), a spinel oxide including zinc and aluminum (for example, spinel $ZnAl_2O_4$, and the like), a spinel oxide including magnesium and aluminum (for example, spinel $MgAl_2O_4$, and the like). Particularly, a spinel oxide including zinc and gallium is preferable in terms of being crystallized at a relatively low temperature, and spinel $ZnGa_2O_4$ is more preferable.

In the present embodiment, the protective layer 40 can be hydrogen-free. In other words, a protective layer that is not doped with hydrogen and a protective layer that does not substantially contain hydrogen can be suitably adopted. Herein, "not substantially contain" means that a corresponding component is not actively added, and does not exclude a situation where a corresponding component is inevitably contained or mixed.

When hydrogen is present in the protective layer 40, a malfunction in which the hydrogen as an impurity also enters the semiconductor layer 30 may be caused. For example, when there is an impurity such as hydrogen, the impurity spreads in a semiconductor and a $V_{TH}$ (threshold voltage) shift amount increases. In this regard, for example, when a metal oxide film such as silicon oxide is used as a protective layer by a conventional method, hydrogen is used as a raw material of the metal oxide film, but hydrogen may not be used in the present embodiment. From the perspective, a hydrogen content of the protective layer 40 is preferably equal to or less than $1\times10^{21}$ atm/cc, and is more preferably equal to or less than $1\times10^{18}$ atm/cc. The hydrogen content can be measured by secondary ion mass spectrometry (SIMS) described in an example described later.

The protective layer 40 can also function as a passivation layer. The passivation layer shields the semiconductor layer 30 from the outside environment, and can protect the semiconductor layer 30 from moisture, a metal ion, and the like.

A film thickness of the protective layer 40 may be set equal to or more than 40 nm. An upper limit of the film thickness is not particularly limited, but may be 1 μm.

A material of the substrate 50 is not particularly limited, and a known material can be adopted. Specific examples include, for example, glass, resin, silicon, metal, an alloy, and foil thereof. Particularly, one kind selected from the group consisting of glass, resin, silicon, and combinations of glass, resin, and silicon is preferable.

As resin, for example, a polyacrylate, a polycarbonate, a polyurethane, a polystyrene, a cellulose polymer, a polyolefin, a polyamide, a polyimide, a polyester, a polyphenylene, a polyethylene, a polyethylene terephthalate, a polypropylene, an ethylene-vinylalcohol copolymer, a polyvinyl chloride, and the like can be used.

The substrate 50 may have flexibility. Since CVD having a strong constraint on a film-formation condition may not be used for formation of the protective layer 40, a constraint on a method for film-forming a spinel oxide as the protective layer 40 is small, and the like, limitation on a material of a substrate and the like can be relieved. Thus, even when a material having flexibility is used as the substrate 50, the protective layer 40 can be suitably film-formed. Examples of a substrate having flexibility include the resin material described above.

When the substrate 50 is a film substrate (may also be referred to as a "sheet substrate") having flexibility, a roll-to-roll method for continuously performing film formation with a film substrate in a roll shape and a roll-to-sheet method can be adopted, and increased efficiency, simplification, an improved yield, and the like of a manufacturing step can be expected.

The roll-to-roll method refers to a method for unwinding a film substrate in a roll shape, continuously performing film formation, and rewinding the film substrate into a roll shape. The roll-to-sheet method refers to a method for unwinding a film substrate in a roll shape, continuously performing film formation, and cutting the film substrate to form a sheet.

The third electrode 60 is a gate electrode. The third electrode 60 is not particularly limited, and a known gate electrode can be adopted. Specific examples include a single layer such as Mo, W, Al, Cu, Au, a Cu—Al alloy, an Al—Si alloy, a Mo—W alloy, and an Ni—P alloy, a laminated body thereof, and the like. A method for forming the third electrode 60 being a gate electrode is not particularly limited, and a suitable method can be appropriately adopted in consideration of a material and the like of the substrate 50 and the gate electrode.

The insulating layer 70 is not particularly limited, and a known material can be adopted. Specific examples include, for example, an inorganic material such as $SiO_2$, $Si_3N_4$, SiON, $Al_2O_3$, $Ta_2O_5$, and $HfO_2$, a photo-curable resin, a thermosetting resin, and the like.

In the present embodiment, as in the semiconductor device A, a transistor in which the first electrode 10, second electrode 20, and the third electrode 60 are a source electrode, a drain electrode, and a gate electrode, respectively, may be formed, or the third electrode 60 (gate electrode) may not be provided. According to the present embodiment, the substrate 50 and the insulating layer 70 may not be provided. In this way, the semiconductor device according to the present embodiment is not limited to the configuration illustrated in FIG. 1, and various configurations can be adopted.

Figure 2:
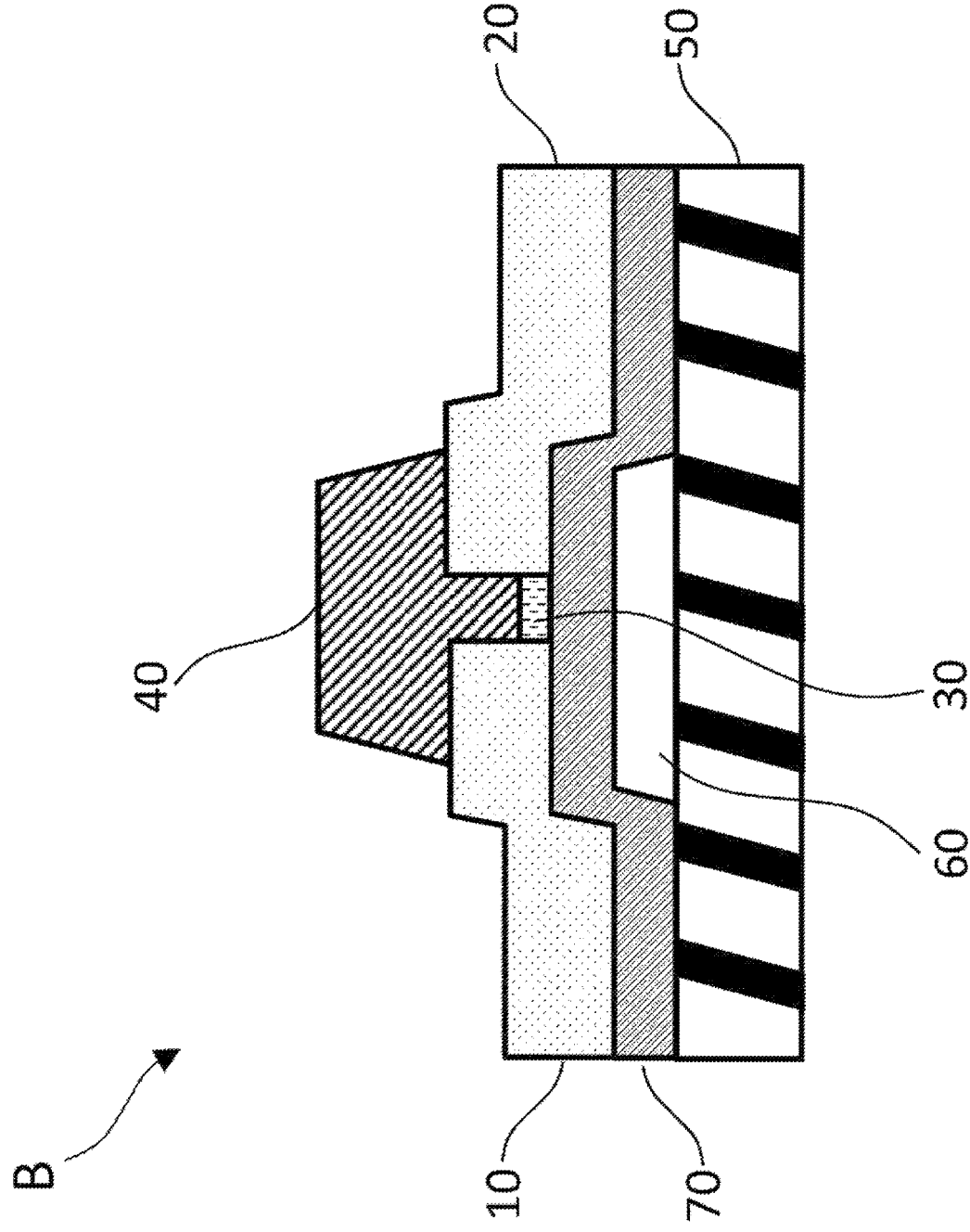
FIG. 2 is a schematic diagram of a semiconductor device B according to a second embodiment.

FIG. 2 is a schematic diagram of a semiconductor device B according to a second embodiment.

The semiconductor device B according to the second embodiment is a bottom gate-bottom contact (BGBC) semiconductor device. In the semiconductor device B, a protective layer 40 covers at least a part of a surface of a semiconductor layer 30.

For each member constituting the semiconductor device B and being common to the semiconductor device A described above, a similar member to that of the semiconductor device A can be adopted unless otherwise specified.

According to the present embodiment, a structure of the semiconductor device is not particularly limited, and a bottom gate-top contact structure (see FIG. 1), a bottom gate-bottom contact structure (see FIG. 2), a top gate-top contact structure, and a top gate-bottom contact structure can be adopted.

The semiconductor devices A and B described so far, of course, have an excellent semiconductor property such as electron conductivity, and can also provide chemical resistance such as acid resistance and base resistance by including the protective layer 40. Then, when the semiconductor devices A and B are formed into a device, a minute and detailed wiring pattern can be expected, and the device can contribute weight reduction as a device and the like. Therefore, the semiconductor devices according to the present embodiments can be suitably used as various sensors such as a pH sensor and a biosensor, and also as a component of a TFT liquid crystal, an organic EL, and the like. Hereinafter, some of the examples will be described.

<pH Sensor>

Figure 3:
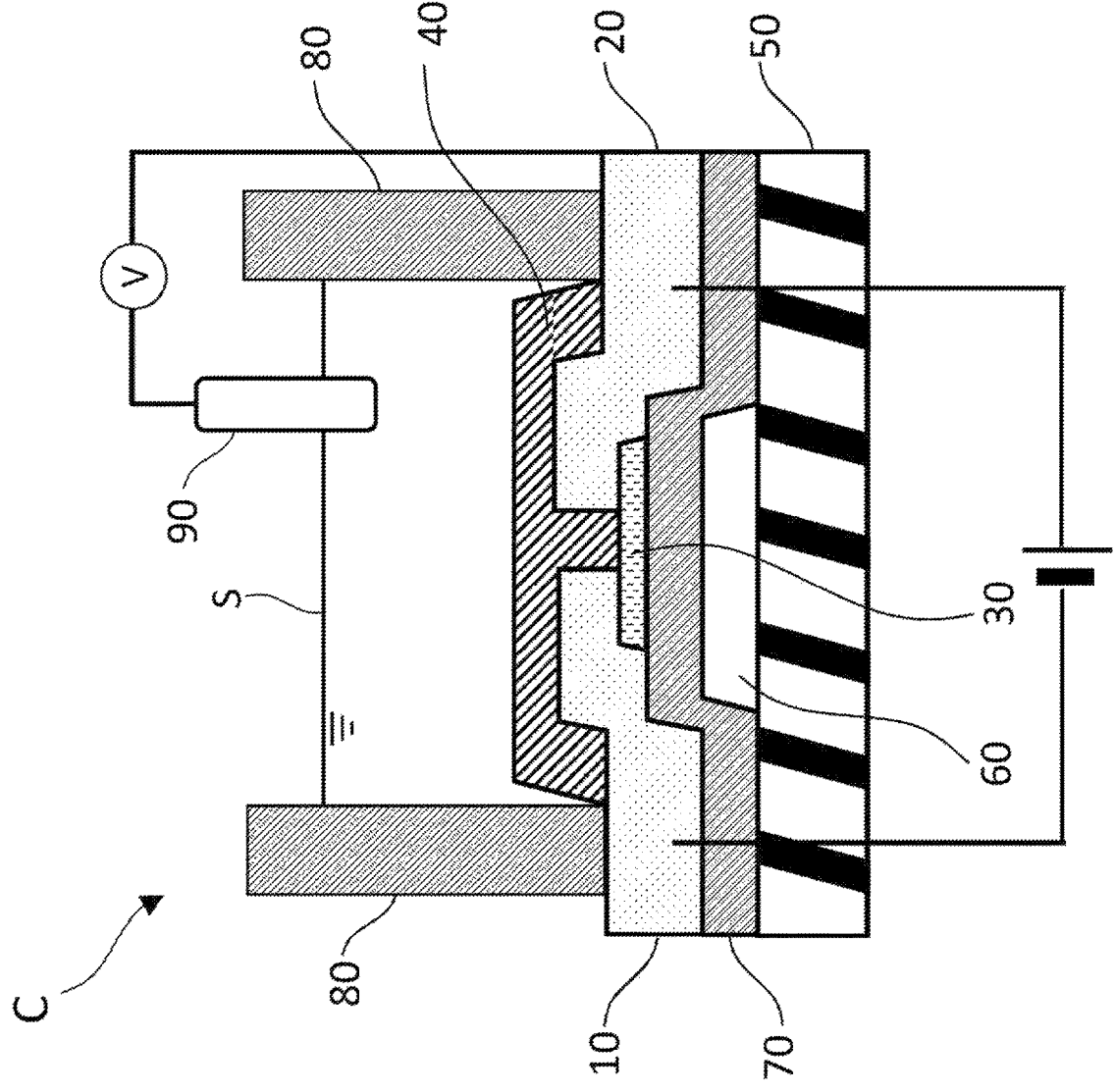
FIG. 3 is a schematic diagram of a pH sensor C including the semiconductor device A according to the first embodiment.

FIG. 3 is a schematic diagram of a pH sensor C including the semiconductor device A according to the first embodiment.

The pH sensor C is, for example, a pH sensor (ion sensitive-FET; ion sensitive field effect transistor) using the semiconductor device A according to the present embodiment.

The pH sensor C includes the semiconductor device A, and a pool wall 80 made of silicon rubber and a reference electrode 90 that are provided above the semiconductor device A. Then, a solution S to be measured (for example, hydrochloric acid in a case of an acid solution, a sodium hydroxide solution in a case of an alkali solution, and the like) fills in a pool constituted by the pool wall 80 to measure a potential difference between the reference electrode 90 and an electrode. Since pH in the solution S depends on a proton amount in the solution, a measurement principle of the pH sensor is to electrically measure the proton amount in the solution and calculate a pH value, based on the measured proton amount.

The semiconductor device A according to the present embodiment can also provide high stability to a strong acid and a strong base. Thus, the pH sensor C using the semiconductor device A has high stability in a wide pH region of pH1 to pH14, and can perform a quick and accurate measurement even when a target material is a strong acid or a strong base.

Here, a case where the semiconductor device A is used is exemplified as an example of the pH sensor, but the semiconductor device B may be, of course, used.

<Biosensor>

Although not illustrated, the semiconductor devices A and B according to the present embodiment can also be used as a biosensor (may also be referred to as a biosensor chip). The biosensor is a chemical sensor using a molecular recognition mechanism of biological origin, and is used as a chemical recognition element of a pH change, an oxidation-reduction reaction, and the like in an organism.

In this regard, the semiconductor devices A and B according to the present embodiment have high stability in a wide pH region, and can thus be a biosensor capable of performing accurate sensing even when a measurement target is a strong acid or a strong base. For example, the semiconductor devices A and B can be a biosensor that causes a specific antibody to be modified on a semiconductor surface and measures a proton amount when a detection target such as DNA specific to the antibody is absorbed.

<Manufacturing Method>

Figure 4:
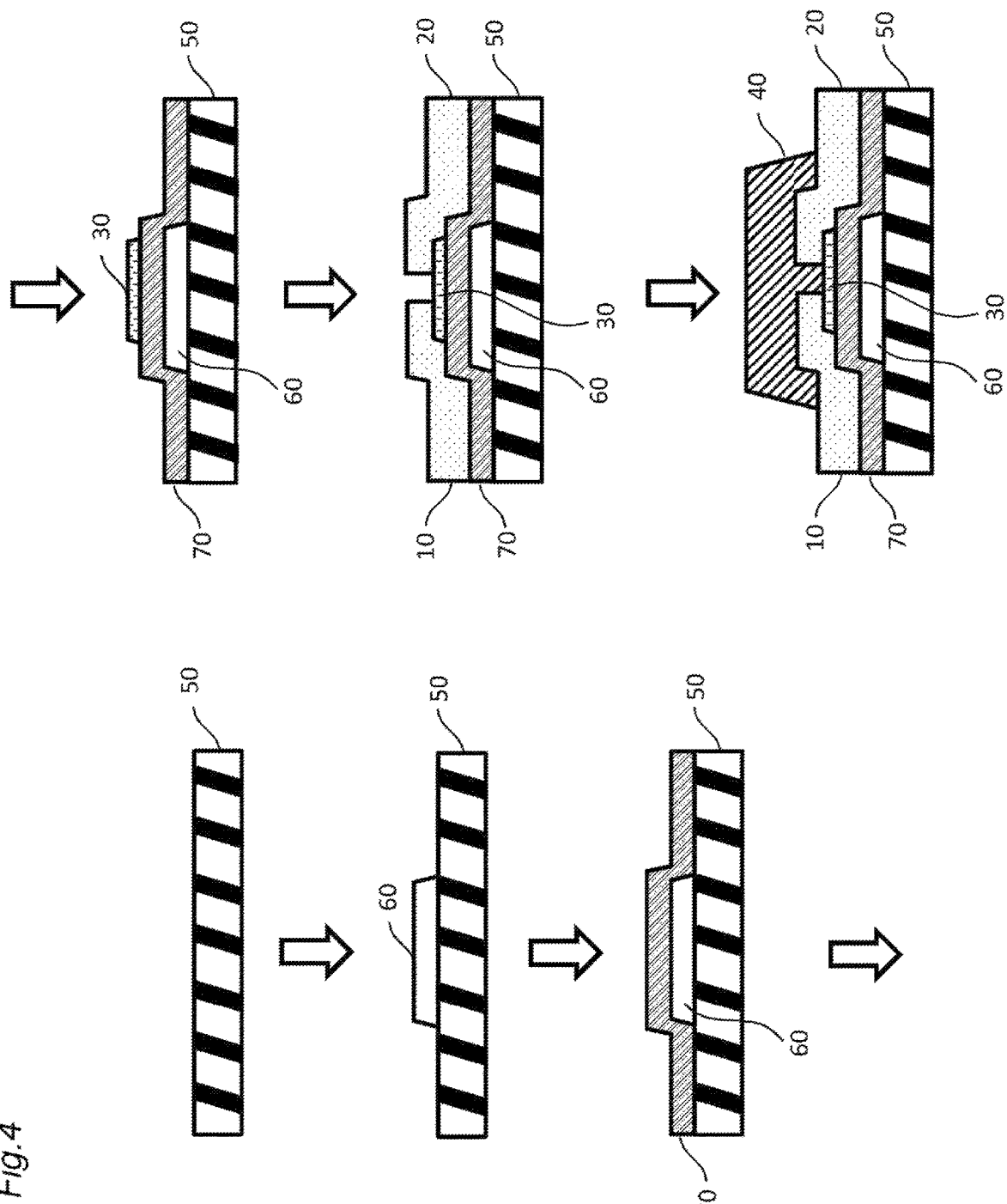
FIG. 4 is a diagram illustrating one example of a method for manufacturing the semiconductor device A according to the first embodiment.

FIG. 4 is a diagram illustrating one example of a method for manufacturing the semiconductor device A according to the first embodiment.

The manufacturing method illustrated in FIG. 4 is the method for manufacturing the bottom gate-top contact semiconductor device A (see FIG. 1). This manufacturing method includes a step of forming the semiconductor layer 30 on the substrate 50, a step of forming a conductive layer (not illustrated) on the substrate 50, a step of forming the first electrode 10 and the second electrode 20 by etching the conductive layer corresponding to a predetermined pattern, and a step of forming the protective layer 40 by performing sputtering at a film-formation temperature equal to or lower than 200 degree Celsius such that the protective layer 40 covers at least a part of the surface of the semiconductor layer 30. Hereinafter, each of the steps will be described in detail.

(First Step)

First, the third electrode 60 is formed on the surface of the substrate 50. The third electrode 60 corresponds to the gate electrode described above. The method for forming the third electrode 60 on the surface of the substrate 50 is not particularly limited, and a suitable method can be appropriately adopted in consideration of a material and the like of the substrate 50 and the electrode.

(Second Step)

Next, the insulating layer 70 is formed on the surface of the substrate 50 on the side on which the third electrode 60 is formed, and the third electrode 60 is covered by the insulating layer 70. The method for forming the insulating layer 70 is not particularly limited, and a suitable method can be appropriately adopted in consideration of a material and the like of the substrate 50, the third electrode 60, and the insulating layer 70.

(Third Step)

Then, the semiconductor layer 30 is formed on a surface of the insulating layer 70. The semiconductor layer 30 is preferably formed by a sputtering method. In this case, a sputtering device can be used for formation, and a predetermined semiconductor layer 30 may be formed by using a plurality of cathodes. For sputtering, single simultaneous sputtering targeted for a material of a single kind may be adopted, or co-sputtering targeted for materials of a plurality of kinds may be adopted.

As one example, a case where the semiconductor layer 30 is formed of an IGZO thin film will be described. In this case, an oxide sintered body being $InGaZnO_4$ may be targeted (single simultaneous sputtering), or control may be performed to obtain an IGZO film having a desired composition by tilting a composition ratio by using three kinds of In$_2$O$_3$, Ga$_2$O$_3$, and ZnO in a multiple simultaneous manner (multiple simultaneous sputtering, co-sputtering).

For example, in a case of an n-type semiconductor material, producing by element doping and oxygen deficiency in a film can be achieved. An element in which an n-type semiconductor can be obtained is not particularly limited, but examples of the element include Al, In, Sn, Sb, and Ta. A method for causing oxygen deficiency is not particularly limited, and a known method can be adopted. Specifically, heat treatment is preferably performed under an oxygen-vulnerable atmosphere or under a reducing gas atmosphere such as hydrogen and vapor. Examples include a method for performing film formation in a state in which hydrogen is mixed in a sputtering gas, and performing n-type carrier doping by interstitial hydrogen. The processing may be performed in a chamber after film formation, or firing may be performed as a post-step.

A film-formation temperature of the semiconductor layer 30 is preferably equal to or higher than 190 degree Celsius in terms of improving crystallinity of the semiconductor layer 30. An upper limit of the film-formation temperature is preferably 400 degree Celsius.

Note that excessive heating may cause evaporation of Zn particles flying to the surface of the substrate 50, and a deviation (composition deviation) from a stoichiometric mixture ratio between Ga and Zn may occur, but a Zn concentration in a film can be increased by simultaneously discharging a sintered body target including Zn or ZnO, and the composition deviation can be effectively prevented.

(Fourth Step)

A step of forming a conductive layer (not illustrated) having conductivity on the semiconductor layer 30, and forming the first electrode 10 and the second electrode 20 by etching the conductive layer corresponding to a predetermined pattern. The first electrode 10 is a source electrode, and the second electrode 20 is a drain electrode. As a method for forming the first electrode 10 and the second electrode 20, a normal photolithography step can be used. In this case, the conductive layer is formed on the semiconductor layer 30, a resist layer is then formed on the conductive layer, and the resist layer is exposed and developed with predetermined pattern light. Next, the first electrode 10 and the second electrode 20 can be formed by etching the conductive layer exposed from an opening of the resist layer. Note that, as the resist layer, a positive material may be used or a negative material may be used.

In this case, an etching solution is preferably an acid solution. Since a resist material used in the normal photolithography step is alkaline and soluble, the conductive layer can be suitably etched by using the acid solution without dissolving the resist layer. Note that, although not illustrated, an etching stop layer may be formed on the semiconductor layer 30 before the conductive layer is formed. In this way, when the conductive layer is etched, deterioration due to contact of the semiconductor layer 30 with an etching solution can be suppressed.

(Fifth Step)

Then, the semiconductor device A can be obtained by forming the protective layer 40 on the first electrode 10 and the second electrode 20 that are formed in the fourth step. Forming the protective layer 40 on an outermost surface of the substrate 50 enables protection of the inside of the semiconductor device A from moisture, a metal ion, and the like from the outside.

Since it is considered preferable to adopt a metal oxide film such as silicon oxide and aluminum oxide for a conventional protective layer, a film-formation temperature thereof needs to be equal to or higher than 300 degree Celsius. However, in the manufacturing method according to the present embodiment, a film-formation temperature of a spinel oxide to be used is a low temperature and a film-formation speed is also fast, and thus the semiconductor device can be easily and efficiently manufactured. For example, when a resin substrate is used as the substrate 50, a usable temperature thereof is a relatively low temperature, and thus a film-formation temperature is preferably a low temperature. From the perspective, a film-formation temperature of the protective layer 40 is equal to or lower than 200 degree Celsius, and is preferably equal to or lower than 190 degree Celsius.

As one example, a case where the protective layer 40 is formed of a spinel oxide including zinc (Zn) and gallium (Ga) will be described. In this case, by using the oxide as the protective layer 40, strong resistance to a strong acid and a strong base appearing in the protective layer 40 can also be expected.

For example, by performing co-sputtering by using a gallium zinc oxide and a zinc oxide as a target, the protective layer 40 formed of a spinel gallium zinc oxide can be formed. Alternatively, a method for performing co-sputtering by using a gallium oxide and a zinc oxide as a target, or a method for performing co-sputtering by using gallium and zinc as a target and oxidizing gallium and zinc with a reactive gas during film formation may be used. Furthermore, the present disclosure is not limited to co-sputtering, and a method for performing sputtering by using a mixture of a zinc oxide and a gallium oxide as a target, or a method for performing sputtering by using a mixture of zinc and gallium as a target and oxidizing the mixture with a reactive gas during film formation may be used.

The semiconductor device A obtained in such a manner may be subjected to another step as necessary in order to have a desired device configuration. For example, a pre-treatment step before forming each portion, a surface polishing step after forming each portion, a dicing step, a mounting step onto a lead frame, an assembly step of performing packaging after circuit formation, a wire bonding step, a mold sealing step, and the like can be appropriately adopted.

Figure 5:
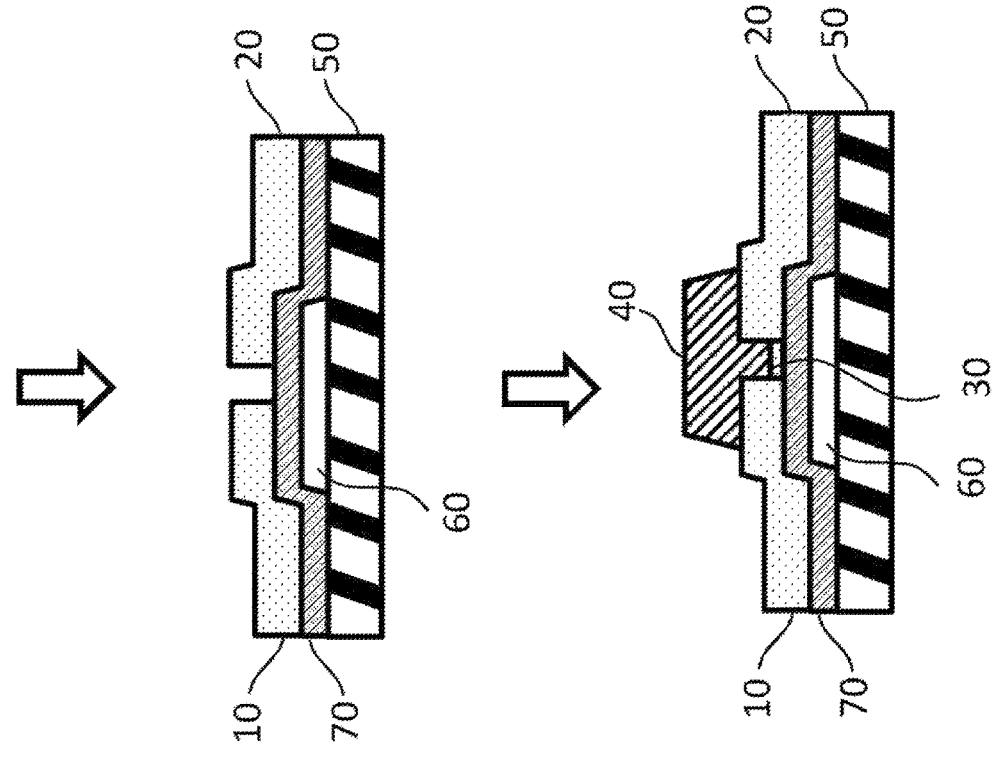
FIG. 5 is a diagram illustrating one example of a method for manufacturing the semiconductor device B according to the second embodiment.
Figure 5:
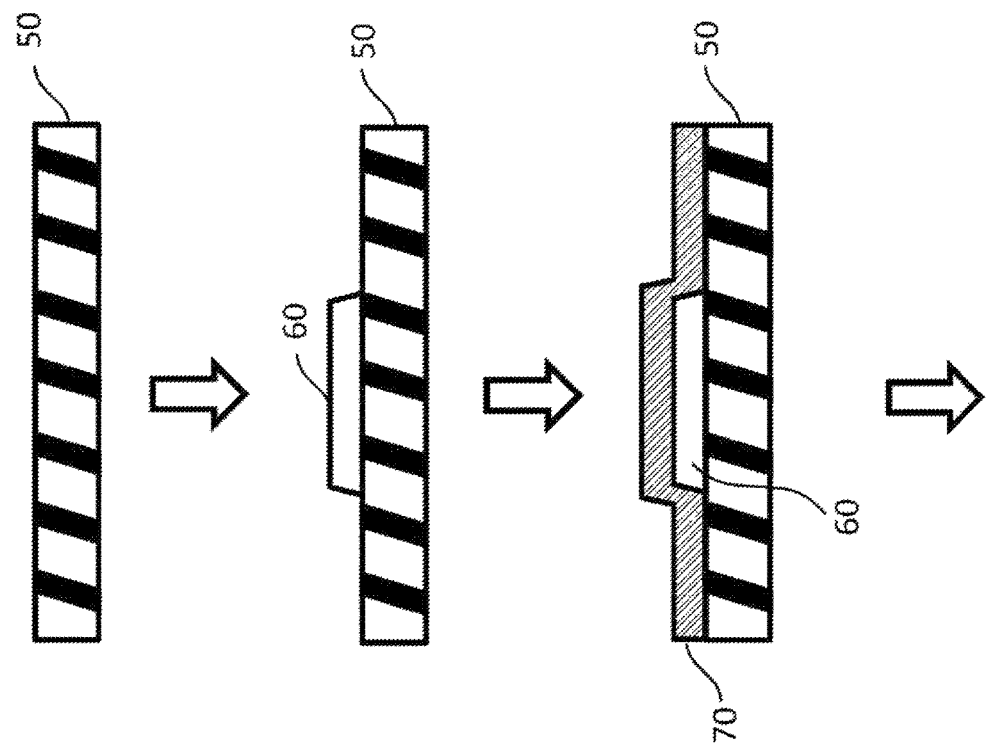

FIG. 5 is a diagram illustrating one example of a method for manufacturing the semiconductor device B according to the second embodiment.

The manufacturing method illustrated in FIG. 5 is the method for manufacturing the bottom gate-bottom contact semiconductor device B (see FIG. 2). This manufacturing method continuously forms the semiconductor layer 30 and the protective layer 40. Hereinafter, each of the steps will be described in detail.

(First Step)

First, the third electrode 60 is formed on the surface of the substrate 50. The third electrode 60 corresponds to the gate electrode described above. The method for forming the third electrode 60 on the surface of the substrate 50 is not particularly limited, and a suitable method can be appropriately adopted in consideration of a material and the like of the substrate 50 and the electrode.

(Second Step)

Next, the insulating layer 70 is formed on the surface of the substrate 50 on the side on which the third electrode 60 is formed, and the third electrode 60 is covered by the insulating layer 70. The method for forming the insulating layer 70 is not particularly limited, and a suitable method can be appropriately adopted in consideration of a material and the like of the substrate 50, the third electrode 60, and the insulating layer 70.

(Third Step)

Then, a step of forming a conductive layer (not illustrated) having conductivity on a surface of the insulating layer 70, and forming the first electrode 10 and the second electrode 20 by etching the conductive layer corresponding to a predetermined pattern. The first electrode 10 is a source electrode, and the second electrode 20 is a drain electrode. As a method for forming the first electrode 10 and the second electrode 20, a normal photolithography step can be used. In this case, the conductive layer is formed on the insulating layer 70, a resist layer is then formed on the conductive layer, and the resist layer is exposed and developed with predetermined pattern light. Next, the first electrode 10 and the second electrode 20 can be formed by etching the conductive layer exposed from an opening of the resist layer. Note that, as the resist layer, a positive material may be used or a negative material may be used.

In this case, an etching solution is preferably an acid solution. Since a resist material used in the normal photolithography step is alkaline and soluble, the conductive layer can be suitably etched by using the acid solution without dissolving the resist layer.

(Fourth Step)

Then, the semiconductor layer 30 is formed on the surface of the insulating layer 70 such that the semiconductor layer 30 is in contact with the first electrode 10 and the second electrode 20. Subsequently, the protective layer 40 is formed so as to cover the semiconductor layer 30.

The semiconductor layer 30 and the protective layer 40 are preferably formed by a sputtering method. In this case, a sputtering device can be used for formation, and a predetermined semiconductor layer 30 and a predetermined protective layer 40 are preferably formed by using a plurality of cathodes. Forming the semiconductor layer 30 and the protective layer 40 by the same formation technique (for example, a sputtering method) enables the semiconductor layer 30 and the protective layer 40 to be easily continuously formed.

For sputtering, single simultaneous sputtering targeted for a material of a single kind may be adopted, or co-sputtering targeted for materials of a plurality of kinds may be adopted.

As one example, a case where the semiconductor layer 30 is formed of an IGZO thin film will be described. In this case, an oxide sintered body being $InGaZnO_4$ may be targeted (single simultaneous sputtering), or control may be performed to obtain an IGZO film having a desired composition by tilting a composition ratio by using three kinds of $In_2O_3$, $Ga_2O_3$, and ZnO in a multiple simultaneous manner (multiple simultaneous sputtering, co-sputtering).

For example, in a case of an n-type semiconductor material, producing by element doping and oxygen deficiency in a film can be achieved. An element in which an n-type semiconductor can be obtained is not particularly limited, but examples include Al, In, Sn, Sb, and Ta. A method for causing oxygen deficiency is not particularly limited, and a known method can be adopted. Specifically, heat treatment is preferably performed under an oxygen-vulnerable atmosphere or under a reducing gas atmosphere such as hydrogen. Examples include a method for performing film formation in a state in which hydrogen is mixed in a sputtering gas, and performing n-type carrier doping by interstitial hydrogen. The processing may be performed in a chamber after film formation, or firing may be performed as a post-step.

A film-formation temperature of the semiconductor layer 30 is preferably equal to or higher than 105 degree Celsius in terms of improving a film density of the semiconductor layer 30, and is more preferably equal to or higher than 150 degree Celsius. An upper limit of the film-formation temperature is preferably 300 degree Celsius.

Note that excessive heating may cause evaporation of Zn particles flying to the surface of the substrate 50, and a deviation (composition deviation) from a stoichiometric mixture ratio between Ga and Zn may occur, but a Zn concentration in a film can be increased by simultaneously discharging a sintered body target including Zn or ZnO, and the composition deviation can be effectively prevented.

Then, forming the protective layer 40 on an outermost surface of the substrate 50 enables protection of the inside of the semiconductor device B from moisture, a metal ion, and the like from the outside.

Since it is considered preferable to adopt a metal oxide film such as silicon oxide and aluminum oxide for a conventional protective layer, a film-formation temperature thereof needs to be equal to or higher than 300 degree Celsius. In contrast, in the manufacturing method according to the present embodiment, a film-formation temperature is a low temperature and a film-formation speed is also fast, and thus the semiconductor device can be easily and efficiently manufactured. For example, when a resin substrate is used as the substrate 50, a usable temperature thereof is a relatively low temperature, and thus a film-formation temperature is preferably a low temperature. From the perspective, a film-formation temperature of the protective layer 40 is equal to or lower than 200 degree Celsius, and is preferably equal to or lower than 190 degree Celsius.

As one example, a case where the protective layer 40 is formed of a spinel oxide including zinc (Zn) and gallium (Ga) will be described. In this case, by using the oxide as the protective layer 40, strong resistance to a strong acid and a strong base appearing in the protective layer 40 can also be expected.

For example, by performing co-sputtering by using a gallium zinc oxide and a zinc oxide as a target, the protective layer 40 formed of a spinel gallium zinc oxide can be formed. Alternatively, a method for performing co-sputtering by using a gallium oxide and a zinc oxide as a target, or a method for performing co-sputtering by using gallium and zinc as a target and oxidizing gallium and zinc with a reactive gas during film formation may be used. Furthermore, the present disclosure is not limited to co-sputtering, and a method for performing sputtering by using a mixture of a zinc oxide and a gallium oxide as a target, or a method for performing sputtering by using a mixture of zinc and gallium as a target and oxidizing the mixture with a reactive gas during film formation may be used.

In the present embodiment, both of the semiconductor layer 30 and the protective layer 40 are preferably formed by a sputtering method. For example, when the semiconductor layer 30 is formed of IGZO and the protective layer 40 is a spinel gallium zinc oxide, a target of the sputtering method can be commonly used, and thus the semiconductor layer 30 can be formed and then the protective layer 40 can be continuously formed in the same device. In this way, easy and continuous manufacturing can be achieved without scaling up a device configuration.

The semiconductor device B obtained in such a manner may be subjected to another step as necessary in order to have a desired device configuration. For example, a pre-treatment step before forming each portion, a surface polishing step after forming each portion, a dicing step, a mounting step onto a lead frame, an assembly step of performing packaging after circuit formation, a wire bonding step, a mold sealing step, and the like can be appropriately adopted.

EXAMPLES

The present invention will be described in more detail with examples and comparative examples below, but the present invention is not limited at all to the examples below.

First Example

Figure 6:
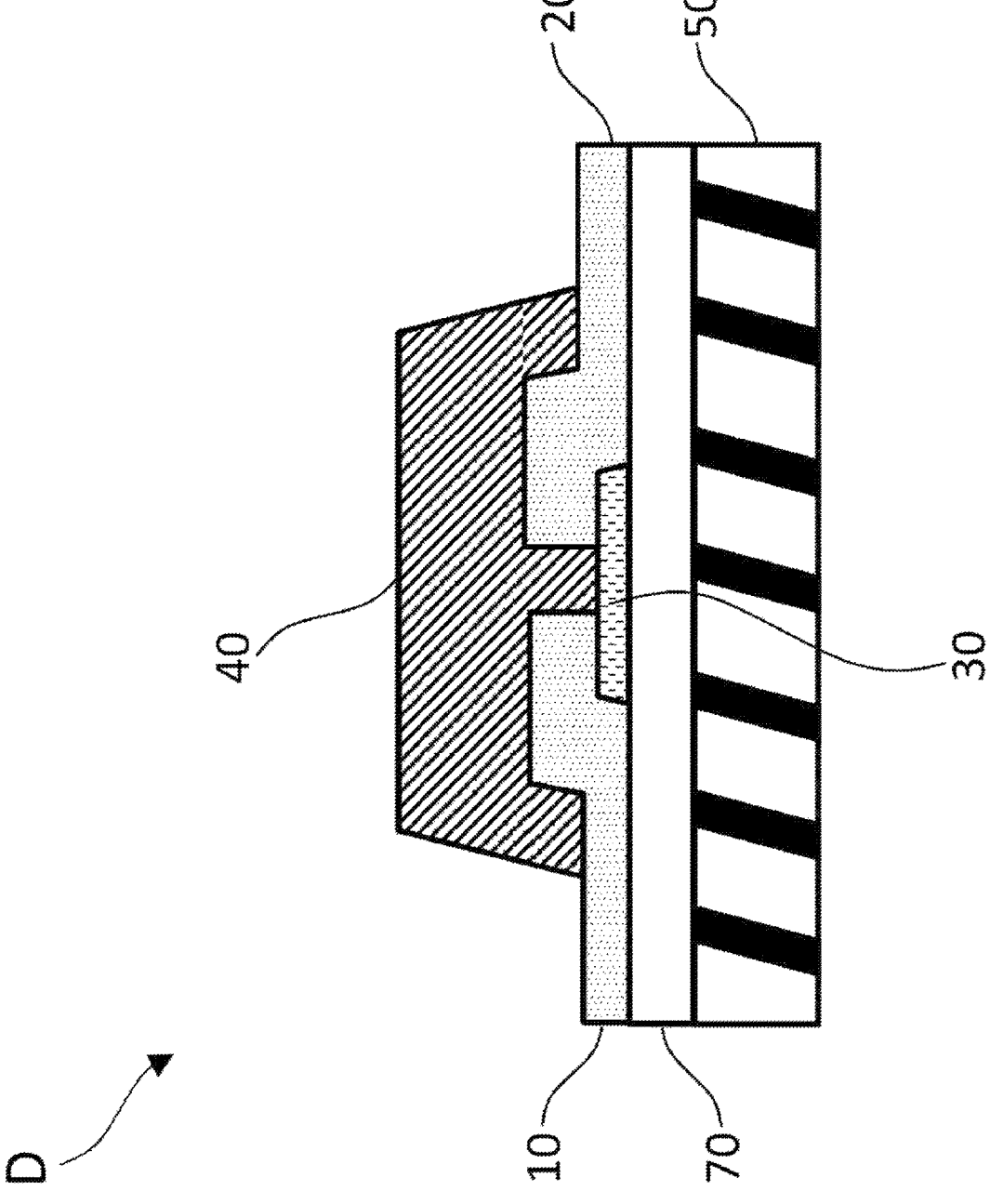
FIG. 6 is a schematic cross-sectional view of a semiconductor device D according to a first example.

FIG. 6 is a schematic cross-sectional view of a semiconductor device D according to a first example.
(Formation of Semiconductor Film)

First, a highly conductive p-type silicon substrate in which a thermal oxide film ($SiO_2$) of 200 nm was formed on a silicon wafer subjected to p-type doping (boron doping) was prepared. An $\alpha$-IGZO thin film was formed on the substrate. The $\alpha$-IGZO thin film was formed by an RF sputtering method by using an InGaZnO target in which an atomic number concentration of In:Ga:Zn was 1:1:1. Note that a substrate temperature during film formation was 105 degree Celsius.
(Formation of Source and Drain Electrodes)

Then, an Al electrode (film thickness of 80 nm) to be source and drain electrodes was film-formed by a vacuum evaporation method using a metal mask. The formation of the source and drain electrodes was performed by using a resistance heating vacuum evaporation device.
(Formation of Protective Layer (Passivation Film))

Next, a spinel $ZnGa_2O_4$ thin film was formed as a protective layer so as to cover the $\alpha$-IGZO thin film described above, and the protective layer was obtained as a passivation film. The formation of the $ZnGa_2O_4$ thin film was performed by using the same sputtering device used for the formation of the $\alpha$-IGZO thin film, and was performed by co-sputtering that simultaneously performed sputtering on a ZnO target and a $Ga_2O_3$ target. A target output was controlled such that a composition ratio of Zn and Ga is 1:2, and substrate heating was performed at 190 degree Celsius to obtain $ZnGa_2O_4$ having a spinel crystalline structure. Particularly, for a sputtering gas, Ar containing 3% of hydrogen was normally used for formation of a semiconductor layer in many cases. However, since the passivation film was formed in the present example, Ar gas that did not contain hydrogen was used. At the same time, oxygen as a reactive gas was introduced at a rate of 10% in a volume ratio to Ar. In this way, control was performed to prevent deficiency of hydrogen and oxygen. Then, film formation was performed under conditions that back pressure was equal to or less than $1\times10^{-4}$ Pa, film-formation pressure was 0.22 Pa, and a film-formation temperature was 190 degree Celsius. In this way, the semiconductor device D having the structure illustrated in FIG. 6 was produced.

Figure 7:
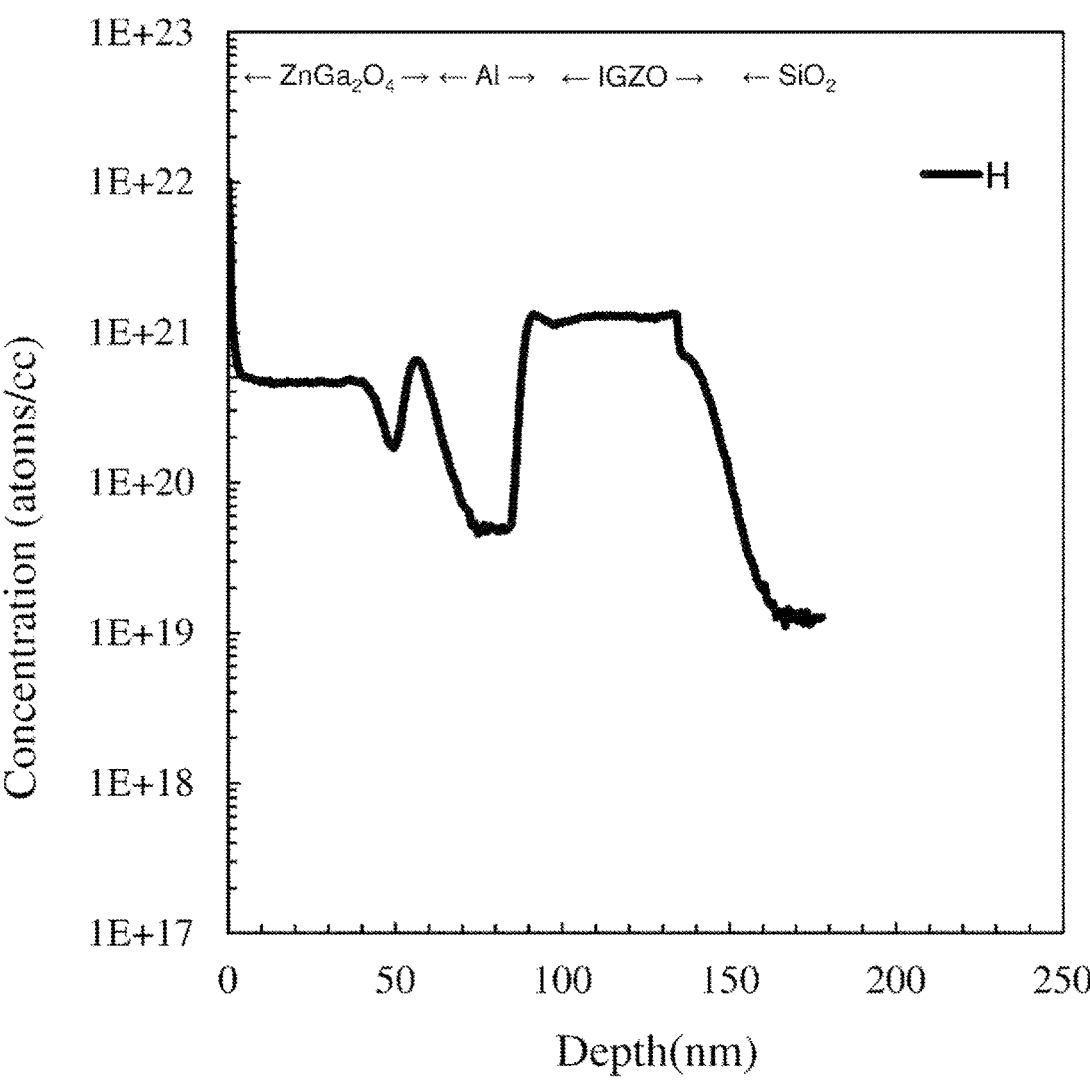
FIG. 7 is a graph of an SIMS measurement result according to the first example.

FIG. 7 is a graph of an SIMS measurement result according to the first example.

A structure confirmation of the obtained semiconductor device was performed by a $\theta$-$2\theta$ measurement by XRD (X-ray diffractometry) and secondary ion mass spectrometry (SIMS). The result is illustrated in FIG. 7. In this way, it was confirmed that the $ZnGa_2O_4$ thin film was the spinel $ZnGa_2O_4$ thin film, and a hydrogen content of the passivation film was equal to or less than $1\times10^{21}$ atm/cc.

First Comparative Example

A semiconductor device was produced similarly to the first example except for a point that the passivation film was not formed.
<Evaluation Method>

For the obtained semiconductor device, an electrical property as a thin film transistor (TFT) was evaluated by using a semiconductor parameter analyzer (4200-SCS, made by Keithley Instruments). Specifically, provided that a gate electrode was a Si substrate and source and drain electrodes were an Al electrode, bias stress resistance below was evaluated.
(1) Positive Bias Stress (PBS) Resistance +20 V was applied to the gate electrode for 0 second, 10 seconds, 100 seconds, and 1000 seconds, and each transmission property was measured.
(2) Negative Bias Stress (NBS) Resistance −20 V was applied to the gate electrode for 0 second, 10 seconds, 100 seconds, and 1000 seconds, and each transmission property was measured.
(3) Negative Bias Illumination Stress (NBIS) Resistance −20 V was applied to the gate electrode for 0 second, 10 seconds, 100 seconds, and 1000 seconds, white light (illumination condition: 1000 lux) was applied, and each transmission property was measured.

Figure 8:
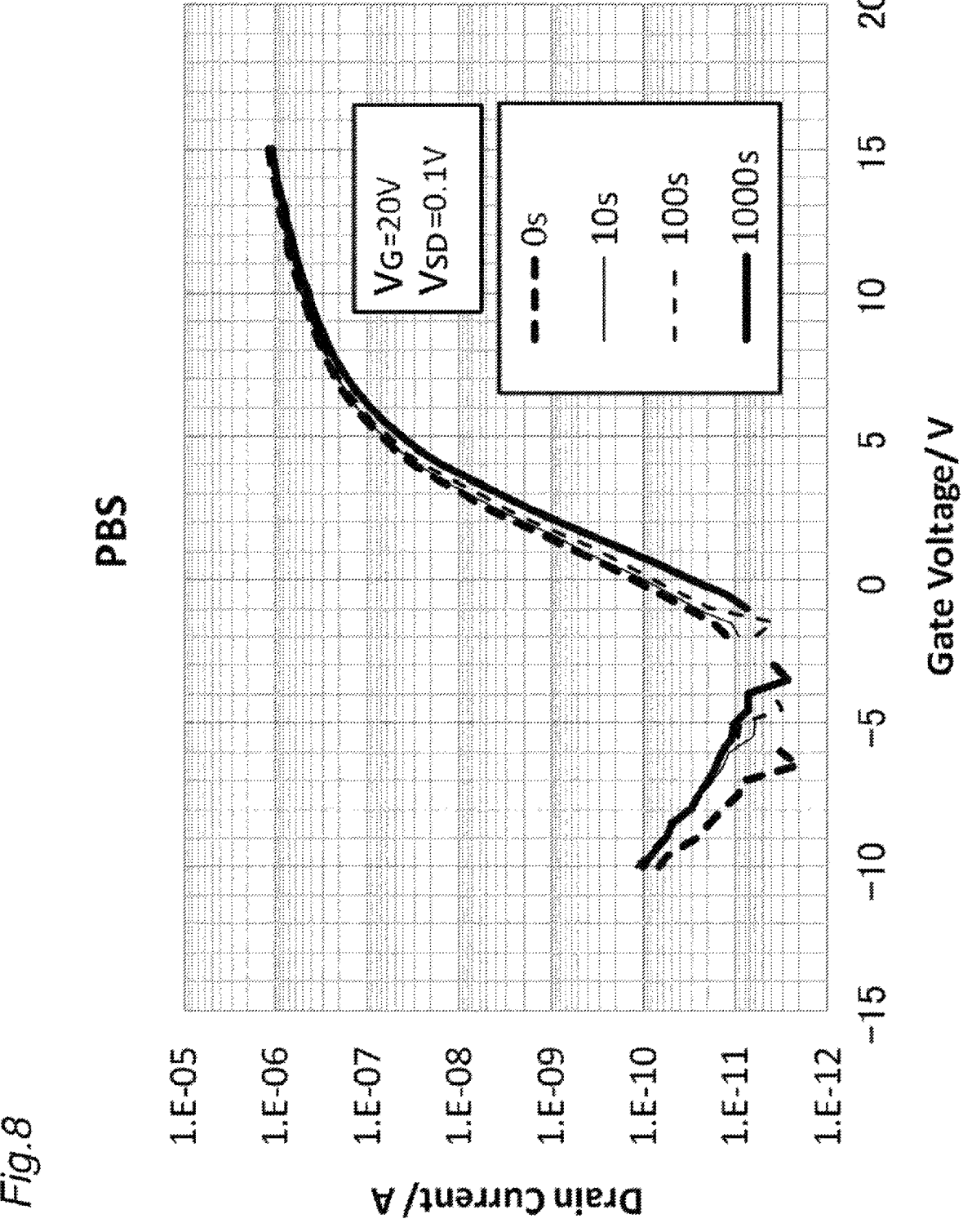
FIG. 8 is a graph of a PBS test according to the first example.
Figure 9:
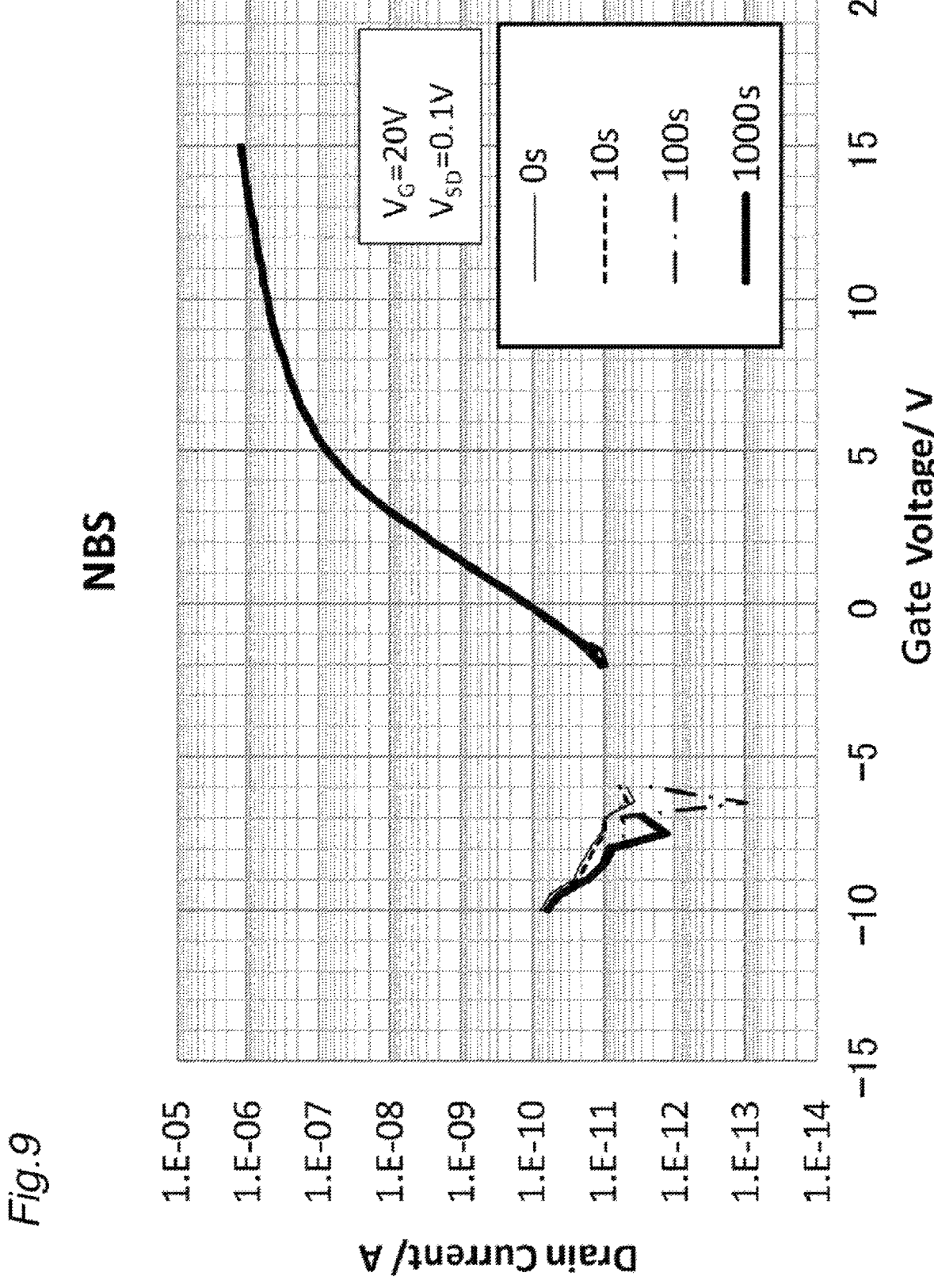
FIG. 9 is a graph of an NBS test according to the first example.
Figure 10:
FIG. 10 is a graph of an NBIS test according to the first example.

FIG. 8 is a graph of a PBS test according to the first example. FIG. 9 is a graph of an NBS test according to the first example. FIG. 10 is a graph of an NBIS test according to the first example.

It was confirmed from FIGS. 8 to 10 that the semiconductor device according to the first example had a small shift from 0 second to 1000 seconds and had excellent mobility as a transistor. Then, it was also confirmed that the semiconductor device according to the first example could be produced by a manufacturing method in which a film-formation temperature was low and a film-formation speed was also fast, and had an excellent semiconductor property due to a small impurity content.

Figure 11:
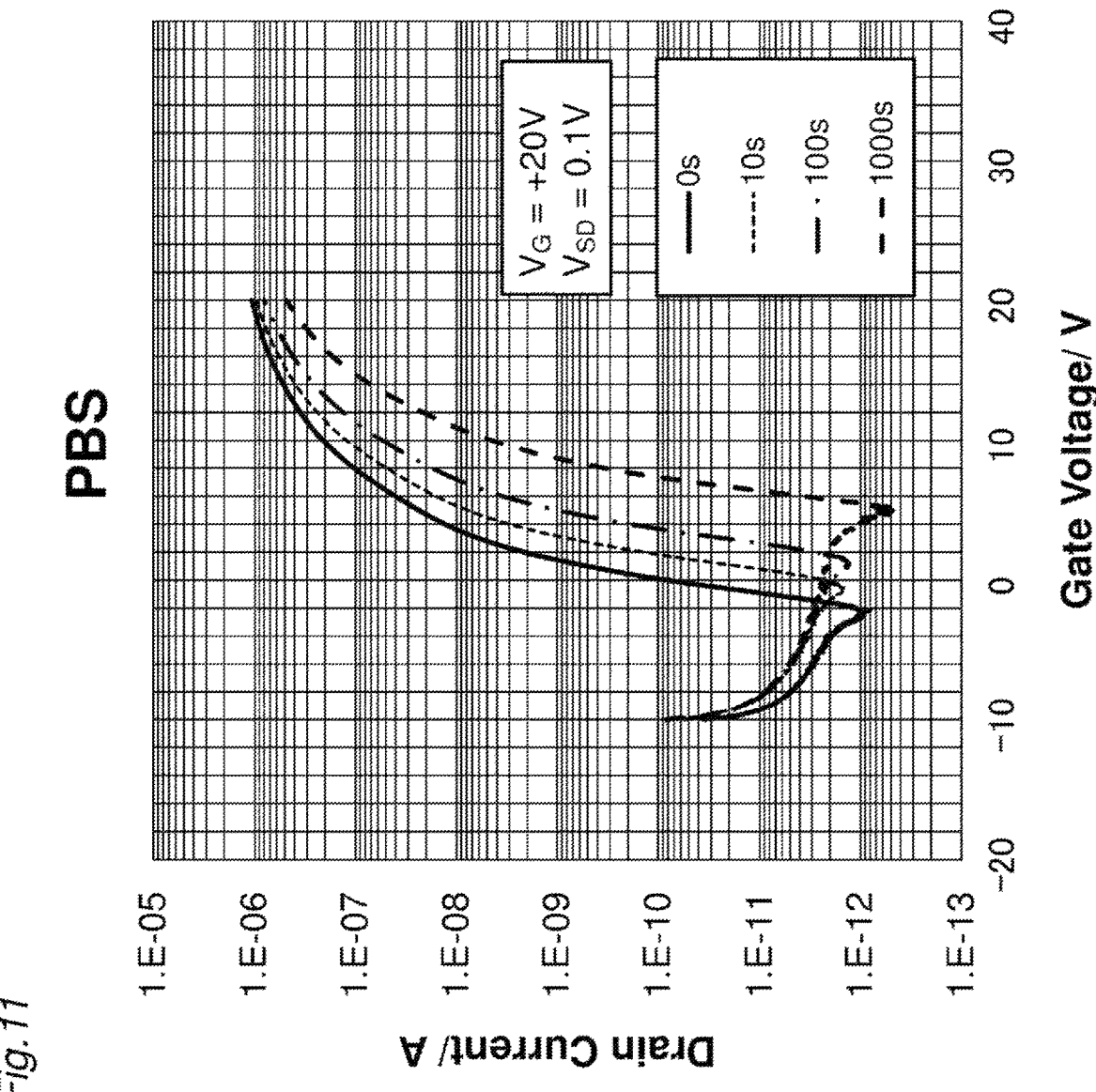
FIG. 11 is a graph of a PBS test according to a first comparative example.
Figure 12:
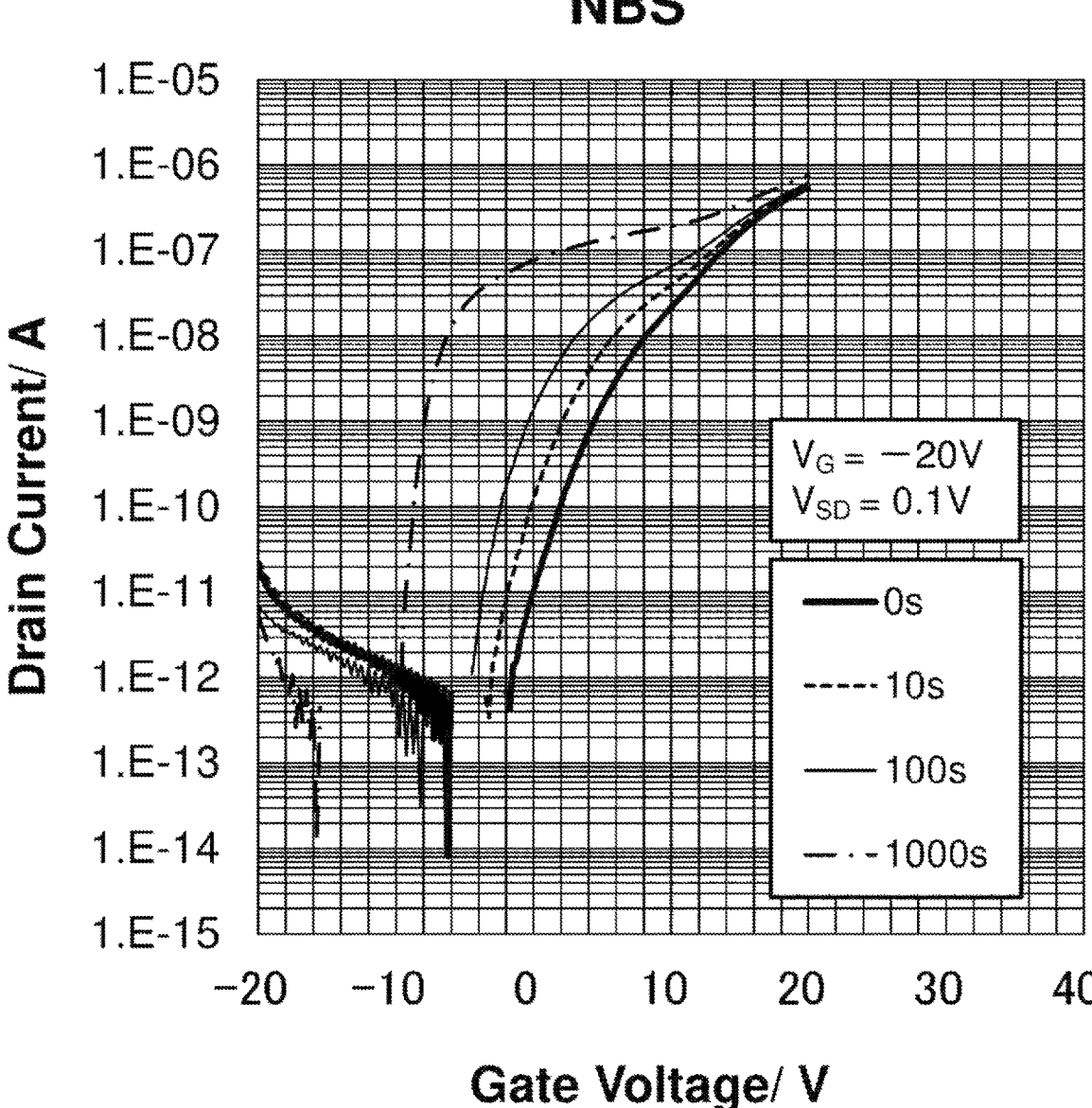
FIG. 12 is a graph of an NBS test according to the first comparative example.

FIG. 11 is a graph of a PBS test according to a first comparative example. FIG. 12 is a graph of an NBS test according to the first comparative example.

It was confirmed from FIGS. 11 and 12 that the semiconductor device according to the first comparative example had a great shift from 0 second to 1000 seconds and had an inferior semiconductor property. For the NBIS test according to the first comparative example, the semiconductor device was damaged during the measurement, and thus the measurement was impossible.

What is claimed is:

1. A semiconductor device comprising:
   a gate electrode;
   an insulating layer over the gate electrode;
   a semiconductor layer over the insulating layer;
   a source electrode over and in contact with the semiconductor layer;
   a drain electrode over and in contact with the semiconductor layer; and
   a protective layer configured to cover at least a part of a surface of the semiconductor layer, the source electrode, and the drain electrode, wherein
   the semiconductor layer includes a first region overlapping with the source electrode, a second region overlapping with the drain electrode, and a third region not overlapping with any of the source electrode and the drain electrode and overlapping with the gate electrode,
   the protective layer includes a spinel oxide, each of the first region, the second region and the third region comprises hydrogen, a hydrogen concentration of the first region, a hydrogen concentration of the second region, and a hydrogen concentration of the third region are substantially the same, and the protective layer does not substantially contain hydrogen.

2. The semiconductor device according to claim 1, wherein the spinel oxide includes zinc (Zn) and gallium (Ga).

3. The semiconductor device according to claim 1, wherein the spinel oxide is $ZnGa_2O_4$.

4. The semiconductor device according to claim 1, wherein the semiconductor layer includes an oxide including In, Ga, and Zn.

5. The semiconductor device according to claim 1, wherein the semiconductor layer includes $InGaZnO_4$.

6. The semiconductor device according to claim 1, wherein the protective layer has a passivation function.

7. The semiconductor device according to claim 1, wherein a film thickness of the protective layer is equal to or more than 40 nm.

8. The semiconductor device according to claim 1, further comprising a substrate.

9. The semiconductor device according to claim 8, wherein the substrate is one kind selected from the group consisting of glass, resin, silicon, and combinations of glass, resin, and silicon.

10. The semiconductor device according to claim 8, wherein the substrate has flexibility.

11. The semiconductor device according to claim 1, wherein:

the insulating layer is in contact with the semiconductor layer; and the gate electrode is provided to face the semiconductor layer via the insulating layer, and the semiconductor device is a transistor including the source electrode, the drain electrode, and the gate electrode.

12. A pH sensor comprising the semiconductor device according to claim 1.

13. A biosensor comprising the semiconductor device according to claim 1.

14. A method for manufacturing a semiconductor device, the semiconductor device being according to claim 1, the method comprising forming the protective layer by sputtering.

15. The method for manufacturing a semiconductor device according to claim 14, wherein the forming of the protective layer is performed at equal to or lower than 200 degree Celsius.

16. The method for manufacturing a semiconductor device according to claim 14, wherein after forming the semiconductor layer, the forming of the protective layer is performed in the same chamber as a chamber in which the semiconductor layer is formed.

* * * * *